(12) United States Patent
Savithri et al.

(10) Patent No.: US 7,694,269 B2
(45) Date of Patent: Apr. 6, 2010

(54) METHOD FOR POSITIONING SUB-RESOLUTION ASSIST FEATURES

(75) Inventors: Nagaraj Savithri, Dallas, TX (US);
Mark E. Mason, Dallas, TX (US);
William R. McKee, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 310 days.

(21) Appl. No.: 11/678,922

(22) Filed: Feb. 26, 2007

(65) Prior Publication Data
US 2008/0203518 A1  Aug. 28, 2008

(51) Int. Cl.
*G06F 17/50* (2006.01)

(52) U.S. Cl. .............. 716/21; 716/4; 716/10; 716/19

(58) Field of Classification Search .......... None
See application file for complete search history.

(56) References Cited

U.S. PATENT DOCUMENTS

| | | | |
|---|---|---|---|
| 6,703,167 B2 * | 3/2004 | LaCour ................ | 430/5 |
| 6,764,795 B2 | 7/2004 | Aton et al. | |
| 6,902,854 B2 * | 6/2005 | Frankowsky ........... | 430/30 |
| 7,001,693 B2 * | 2/2006 | Liebmann et al. ....... | 430/5 |
| 7,013,439 B2 * | 3/2006 | Robles et al. .......... | 716/4 |
| 7,018,746 B2 * | 3/2006 | Cui et al. ............. | 430/5 |
| 7,115,343 B2 * | 10/2006 | Gordon et al. ......... | 430/5 |
| 7,124,395 B2 * | 10/2006 | Shi et al. ............. | 716/19 |
| 7,261,981 B2 * | 8/2007 | Lavin et al. .......... | 430/5 |
| 7,275,225 B2 * | 9/2007 | Kamat ................ | 716/4 |
| 7,281,234 B2 * | 10/2007 | Lippincott ............ | 716/19 |
| 7,293,249 B2 * | 11/2007 | Robles et al. ......... | 716/8 |
| 7,337,421 B2 * | 2/2008 | Kamat ................ | 716/10 |
| 2005/0120326 A1 * | 6/2005 | Semmler et al. ....... | 716/19 |
| 2005/0202326 A1 * | 9/2005 | Gordon et al. ........ | 430/30 |
| 2006/0075379 A1 | 4/2006 | Kamat | |
| 2007/0101303 A1 * | 5/2007 | Lien et al. ........... | 716/5 |
| 2007/0124708 A1 * | 5/2007 | Robles et al. ......... | 716/4 |

* cited by examiner

*Primary Examiner*—Leigh Marie Garbowski
(74) *Attorney, Agent, or Firm*—Warren L. Franz; Wade J. Brady, III; Frederick J. Telecky, Jr.

(57) ABSTRACT

The present application is directed to a method of selectively positioning sub-resolution assist features (SRAF) in a photomask pattern for an interconnect. The method comprises determining if a first interconnect pattern option will result in improved circuit performance compared with a second interconnect pattern option, where the first option is designed to be formed with SRAF and the second option is designed to be formed without SRAF. If it is determined that the first option will result in improved circuit performance, the first pattern option is selected as a target pattern and one or more SRAF patterns are positioned to facilitate patterning of the first pattern option. If it is not determined that the first option will result in improved performance, the second pattern option is selected as a target pattern.

23 Claims, 2 Drawing Sheets

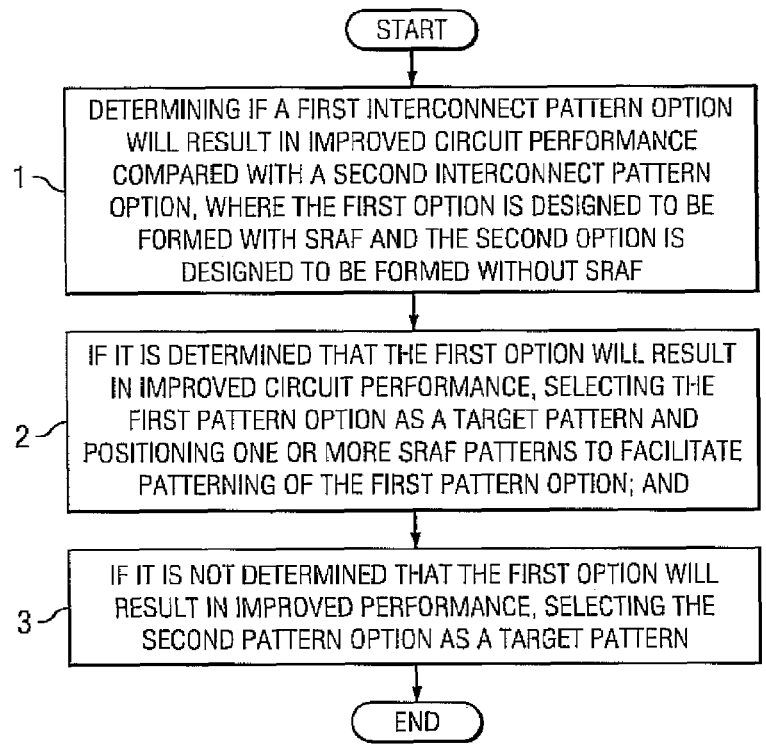
FIG. 1
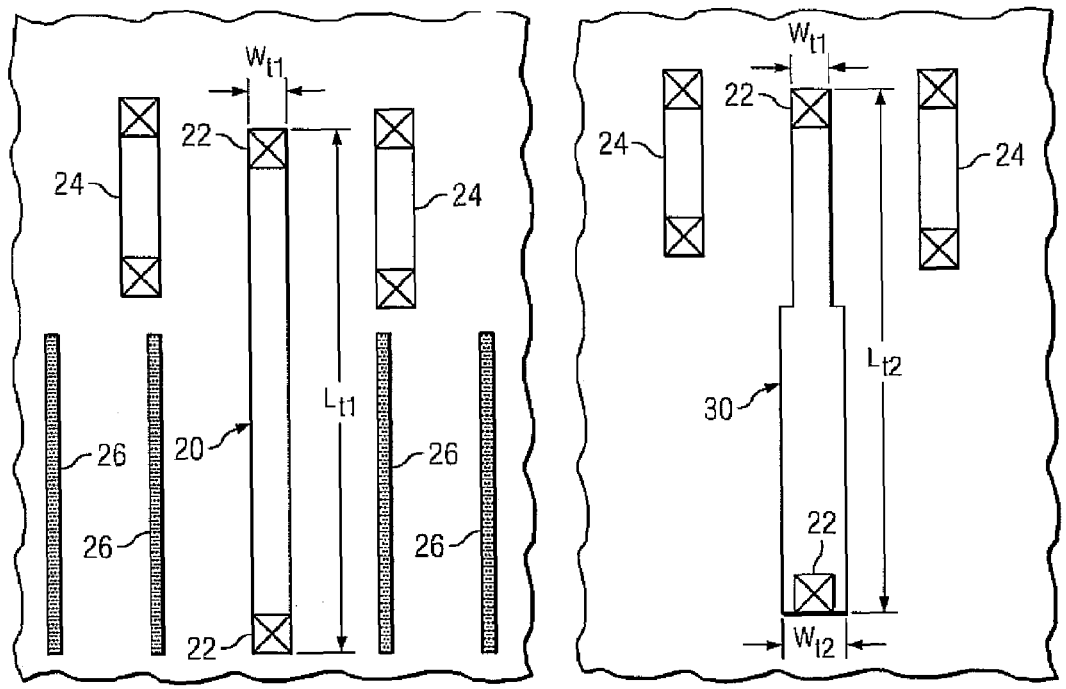
FIG. 2
FIG. 3

METHOD FOR POSITIONING SUB-RESOLUTION ASSIST FEATURES

DESCRIPTION OF THE DISCLOSURE

1. Field of the Disclosure

The present application relates generally to the field of photolithography, and more specifically to a method for selectively positioning sub-resolution assist features of a photomask pattern.

2. Background of the Disclosure

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In optical projection lithography, a mask, or "reticle", is employed that includes a mask pattern for defining device features to be patterned, often formed of, for example, opaque chrome on a transparent glass substrate. A stepper projects light through the mask and images the mask pattern, often with a 4× to 5× reduction factor, onto a photoresist film formed on a wafer.

As the critical dimensions of integrated circuits continue to decrease, there is a need to pattern smaller and smaller features. Modern photolithographic systems often employ light in the imaging process which has a larger wavelength than the critical dimensions of the device features being formed on the integrated circuits. When critical dimensions are printed at less than or equal to the wavelength of light being used, the wave properties of the light become a dominant property of the lithography. In general, these wave properties are seen as being a limiting factor in lithography.

Due to the limitations of photolithographic systems, the patterns formed in the photoresist generally do not coincide exactly with the mask patterns formed on the reticle. Conventional masks often compensate for this phenomenon by forming a mask with features that differ somewhat from the feature desired to be patterned in the photoresist material.

For example, isolated features, which are located in a region of the mask having relatively few mask features, will almost always print at a feature size significantly different from the same mask feature surrounded by a relatively large number of features. This phenomenon, known as iso-dense bias, is caused by the variation in light intensity from the differing feature densities of the different mask regions. To correct for iso-dense bias, sub-resolution assist features (SRAFs), also known as scattering bars, are added to the mask. The SRAFs are designed to increase the light intensity of an isolated feature region so that it is more similar to denser feature regions, and therefore allow the isolated feature to print at the same feature size as the feature in the dense feature regions.

Some reticles, known as dark field reticles, are mainly chrome with Device features opened up where the light is transmitted. Other reticles, known as bright field reticles, are mainly transparent, with the features being defined by chrome. In dark field reticles, the transparent device feature patterns are said to have a negative tone, while in bright field reticles, the chrome device feature patterns are said to have a positive tone.

For any given reticle, the SRAFs can be both positive and negative tone. For example, on a bright field reticle, some SRAFs can be formed of chrome, while other SRAFs may be formed of transparent glass (where, for example, a piece of chrome defines a main feature and the SRAFs are formed by removing pieces of the chrome feature).

An SRAF is a sub-resolution feature and, therefore, is not meant to print. This is in contrast to the main features of the mask, which are designed to print so as to produce a photoresist pattern. SRAFs are generally sized and positioned using computer software. The software employs a set of SRAF rules during generation of the SRAF to specify such things as the number of SRAFs that should be formed between main features, as well as the mask tone (positive or negative), shape length and width of the SRAF. The software also employs other rules, such as mask and/or process rules, to achieve the desired mask quality and help insure that the mask pattern meets the desired specifications.

Today, interconnect pattering has become the bottleneck in achieving continued enhanced circuit performance. When positioning SRAFs for forming interconnect patterns on a photomask, all interconnect patterns, whether short or long, generally get the same processing prior to pattern generation. In sub-100 nm technologies, this often results in interconnect lines being printed much wider than drawn to overcome photolithographic issues, which can result in increased parasitic capacitance and hence reduced circuit performance. Methods for achieving reduced parasitic capacitances and otherwise improving circuit performance are desired.

SUMMARY OF THE DISCLOSURE

In accordance with the disclosure, one embodiment of the present application is directed to a method of selectively positioning sub-resolution assist features (SRAFs) in a photomask pattern for an interconnect. The method comprises determining if a first interconnect pattern option will result in improved circuit performance compared with a second interconnect pattern option, where the first option is designed to be formed with SRAFs and the second option is designed to be formed without SRAFs. If it is determined that the first option will result in improved circuit performance, the first pattern option is selected as a target pattern and one or more SRAF patterns are positioned to facilitate patterning of the first pattern option. If it is determined that the first option will not result in improved performance, the second pattern option is selected as a target pattern.

Another embodiment of the present application is directed to a system for correcting a sub-resolution assist feature (SRAF) pattern for a photomask. The system comprises a database operable to store data describing one or more integrated circuit features having target dimensions; and an SRAF module coupled to the database. The SRAF module is embodied on a computer readable medium and includes a set of instructions operable to determine if a first interconnect pattern option will result in improved circuit performance compared with a second interconnect pattern option, where the first option is designed to be formed with SRAFs and the second option is designed to be formed without SRAFs. If it is determined that the first option will result in improved circuit performance, the instructions are operable to select the first pattern option as a target pattern and position one or more SRAF patterns to facilitate patterning of the first pattern option; and if it is determined that the first option will not result in improved performance, select the second pattern option as a target pattern.

Another embodiment of the present application is directed to an SRAF module embodied on a computer readable medium. The SRAF module comprises a set of instructions operable to determine if a first interconnect pattern option will result in improved circuit performance compared with a second interconnect pattern option, where the first option is designed to be formed with SRAFs and the second option is designed to be formed without SRAFs. If it is determined that the first option will result in improved circuit performance, the instructions are operable to select the first pattern option as a target pattern and position one or more SRAF patterns to facilitate patterning of the first pattern option; and if it is determined that the first option will not result in improved performance, select the second pattern option as a target pattern.

Yet another embodiment of the present application is directed to an Integrated circuit device. The device comprises a plurality of first interconnects formed according to a first pattern option having a first width and a first length. The first pattern option is designed to be formed with SRAFs. A plurality of second interconnects are formed according to a second pattern option having a second width and a second length. The second pattern option is designed to be formed without SRAFs. The integrated circuit has increased performance relative to the same integrated circuit for which the first and second interconnects were formed using the same pattern option.

Additional embodiments and advantages of the disclosure will be set forth in part in the description which follows, and can be learned by practice of the disclosure. It is to be understood that both the foregoing general description and the following detailed description are exemplary and explanatory only and are not restrictive of the disclosure, as claimed.

The accompanying drawings, which are incorporated in and constitute a part of this specification, illustrate several embodiments of the disclosure and, together with the description, serve to explain the principles of the disclosure.

BRIEF DESCRIPTION OF THE DRAWINGS

FIG. 1 illustrates a flow chart of a process for selectively positioning one Or more sub-resolution assist features (SRAFs) when forming an interconnect pattern for a photomask, according to one embodiment of the present application.

FIG. 2 illustrates a schematic top view of an interconnect pattern, according to an embodiment of the present application.

FIG. 3 illustrates a schematic top view of an interconnect pattern, according to an embodiment of the present application.

DESCRIPTION OF THE EMBODIMENTS

Figure 4A:
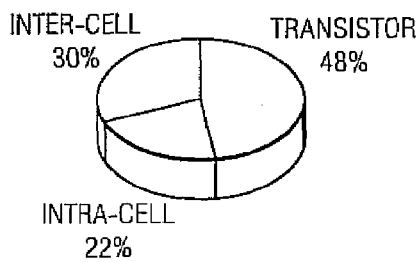
FIGS. 4A and 4B illustrate graphs showing the percentage contribution of each component to total circuit delay for an exemplary gate dominated circuit and exemplary interconnect dominated circuit, respectively.

Reference will now be made in detail to various exemplary embodiments of the present application, examples of which are illustrated in the accompanying drawings. Wherever possible, the same reference numbers will be used throughout the drawings to refer to the same or like parts.

FIG. 1 illustrates a flow chart of a process for selectively positioning one or more sub-resolution assist features (SRAFs) when forming an interconnect pattern for a photomask, according to one embodiment of the present application. The photomask may be used for making any type of photomask known in the art, such as, for example, binary photomasks, phase shift photomasks, attenuating photomasks, as well as others.

The method of FIG. 1 can be performed as part of a more general method for forming a photomask pattern that can include various other additional processes that are not illustrated. Methods for forming photomask patterns are well known in the art, and can involve, for example, generating the feature patterns of the mask from photomask design data stored in a design database. The data can describe target features of an integrated circuit design. The photomask features generally include polygon shaped patterns designed to print photoresist patterns that will form device features having desired target dimensions on a wafer.

Employing the design data, any suitable software program may be used to generate the main features of the mask. Methods and software for forming the main photomask features from the design data base are well known in the art. One example of a suitable mask generation software program is the HERCULES™ software, which is available from Synopsys Inc., Mountain View, Calif.

The method illustrated in the embodiment of FIG. 1 includes selectively positioning sub-resolution assist features (SRAFs) in a photomask pattern for an interconnect, as illustrated at 1. The method includes determining if a first interconnect pattern option will result in improved circuit performance compared with a second interconnect pattern option, where the first option is designed to be formed with SRAFs and the second option is designed to be formed without SRAFs. For purposes of this invention, improved circuit performance is defined in terms of total circuit delay for a given circuit design. Thus, a circuit design in which features are patterned so as to result in a lower total circuit delay is considered to have improved performance in comparison to that same basic circuit design in which the features are patterned to result in an increased total circuit delay.

The interconnect pattern option can be chosen to improve circuit performance. In an embodiment of the present application, the interconnect pattern option can be chosen based on resistive-capacitive delay (RC delay) and crosstalk metrics, as will be discussed in greater detail below.

In an embodiment of the present application, option one can include choosing a first interconnect width for which SRAFs are used to achieve the first width; while option two can include choosing a second interconnect width that can be satisfactorily achieved without the use of SRAFs, meaning that the second width is generally larger than the first width. Selecting a pattern option for the interconnect can include, for example, determining if forming the first pattern option will result in improved circuit performance compared with the second pattern option.

Referring to FIG. 1 at 2, if it is determined that the first option will result in improved circuit performance, the first pattern option is selected as a target pattern and one or more SRAF patterns are positioned to facilitate patterning of the first pattern option. It, on the other hand, it is not determined that the first width will result in improved performance, option two is selected, and a second interconnect pattern can be formed, as indicated in 3. The second interconnect pattern is designed to be formed without necessarily employing SRAF proximate to the interconnect pattern.

As mentioned above, additional processes may be carried out that are not illustrated in FIG. 1. An example of such additional processes can include optical proximity correction (OPC) to correct for optical proximity effects. Any suitable technique for correcting for optical proximity effects may be employed. Examples of suitable optical proximity correction techniques are disclosed in U.S. Pat. No. 6,764,795, issued on Jul. 20, 2004 to Aton et al., the disclosure of which is herein incorporated by reference in its entirety.

Another example of an additional process, known as pattern generation (not illustrated) can be carried out after OPC. Pattern generation is a process generally performed by a computer program that prepares the mask data to go to the mask writer. Suitable software for carrying out pattern generation is well known in the art. One example of a suitable software program known in the art for pattern generation is the HERCULES™ software, which is available from Synopsys, Inc.

The photomask pattern data prepared using the process of the embodiment of FIG. 1 can then used to write the photomask. Often the mask data is sent to an independent mask writer, where the photomasks are made. Any suitable technique for writing the photomask can be used. Suitable techniques for writing photomasks are well known in the art.

FIG. 2 illustrates one embodiment of an interconnect pattern 20, according to option one of the present application. Features 24 of FIG. 2 can be other interconnect patterns or device features positioned proximate to the interconnect 20. As is well known in the art, interconnect 20 can be formed in electrical connection with contact plugs 22, or other device structures.

As seen in FIG. 2, sub-resolution assist features (SRAFs) 26 can be employed to achieve a desired target width, $W_{t1}$, associated with the interconnect pattern 20. The SRAFs can be generated using any suitable computer software. Computer software for generating SRAFs is well known in the art. In some embodiments, the SRAF patterns 26 can be generated in the same step and/or using the same software program as the interconnect pattern 20. Alternatively, the SRAF patterns 26 can be generated in a separate step and/or using a different software program as the interconnect pattern 20.

The SRAFs are not limited to any particular shape. For example, the SRAF patterns 26 may be rectangles, as in the embodiment of FIG. 2, or they may have any other suitable polygon shape, such as the polygon shapes illustrated in U.S. patent application Ser. No. 11/531,048, filed on Sep. 12, 2006, in the name of S. O'Brien, and entitled Method for Achieving Compliant Sub-Resolution Assist Features" (published as U.S. Patent Publ. No. 2008/0063948 A1), the disclosure of which is hereby incorporated by reference in its entirety. Still other shapes may be contemplated by one of ordinary skill in the art. In embodiments of the present application, the SRAFs can be positive or negative tone, as described above.

Any suitable number of SRAFs may be employed and positioned in any desired manner in order to achieve the desired target width, $Wt_{1}$. It should be noted that the target widths and/or target lengths discussed herein correspond to the desired "target" dimensions of the final interconnect patterns to be formed on the semiconductor wafer. As would be readily understood by one of ordinary skill in the art, these target widths may be, and often are, different from the actual widths of the interconnect patterns that are formed on the photomask, the widths of the interconnect patterns that are formed in the developed photoresist during the photolithography process, or the widths of the final interconnect structures that are actually realized on the semiconductor wafer.

FIG. 3 illustrates one embodiment of an interconnect pattern 30, according to option two of the present application. As seen in the embodiment of FIG. 3, SRAF are not employed to achieve a desired target width, $W_{t2}$, associated with the interconnect pattern 30. $W_{t2}$ is greater than $W_{t1}$, and is large enough to successfully be formed without SRAF. As also seen in the embodiment of FIG. 3, a portion of the length of interconnect 30 can have the narrower width, $W_{t1}$, while the remaining portion of interconnect 30 can have the greater width, $W_{t2}$. In yet other embodiments, the entire length of the interconnect 30 can have width $W_{t2}$.

The choice of interconnect widths for $W_{t1}$ and $W_{t2}$ may include any desired suitable widths that can be patterned, such as widths optimized to decrease circuit capacitance and/or decrease resistance of the interconnect. In an embodiment, $W_{t1}$ may be the same dimension as one or more other device patterns of the circuit, such as a gate length; and $W_{t2}$ can be any standard selected interconnect width for the circuit that is large enough to be formed without SRAF.

The increased size of $W_{t2}$ compared to $W_{t1}$ results in both advantages and disadvantages that are related to circuit performance. Resistance of an interconnect increases almost exponentially with decreasing width. Thus, the increased width of interconnect 30 can result in reduced parasitics associated with the resistance of the interconnect, thereby resulting in decreased RC-delay of the circuit. On the other hand, the increased width can increase parasitic capacitance compared to the narrower interconnect 20. Accordingly, the relatively large interconnect width of option two can result in increased parasitic capacitance and decreased resistance, the relatively small interconnect width of option one can result in decreased parasitic capacitance and increased resistance.

By selectively applying either option one or option two to varying interconnect structures within a circuit, the overall circuit performance can be increased by reducing overall parasitics. For example, the longer an interconnect route is, the more of a detrimental effect increased resistance of the interconnect can have on circuit parasitics. On the other hand, shorter interconnect routes can be less sensitive to interconnect resistance. For example, in some cases it has been found that interconnect lengths that are less than 10 microns have almost zero sensitivity to interconnect resistance. Therefore, the parasitics of longer interconnect routes tend to be resistance dominated, while on the other hand, the parasitics of shorter routes can often be capacitance dominated.

Thus, by applying option one having a decreased interconnect width to shorter interconnect routes that are less sensitive to resistance, the parasitic capacitance associated with these routes can be reduced, while the increased resistance associated with the decreased interconnect width has relatively little effect on overall parasitics. Option one can be applied to any desired interconnect having a length that is less than or equal to a selected value. The selected value for interconnect length can be any desired value, such as any discrete value within the range of from about 100 microns or less. For example, in some embodiments, option one can be applied to interconnects having length, $L_{t1}$, of about 100 microns or less, or in other embodiments, about 50 microns or less, or about 25 microns or less. In still other embodiments, option one can be applied to interconnects having lengths outside of the stated ranges.

Similarly, by applying option two, having an increased interconnect width, to longer routes that are more resistance dominated, the overall parasitics associated with these longer routes can be reduced. Option two can be applied to any desired interconnect. For example, in some embodiments, option two can be applied to interconnects having length, $L_{t2}$, that is greater than about 25 microns; or, in other embodiments, to interconnects having lengths greater than about 50 microns, or greater than about 100 microns. In still other embodiments, option two can be applied to interconnects having lengths outside of the stated ranges.

In this manner, SRAFs can be selectively positioned to effectively reduce capacitance in capacitance dominated routes and to effectively reduce resistance in resistance dominated routes. This has the effect of decreasing overall circuit parasitics and increasing circuit performance as compared to the same circuit in which the SRAFs were not selectively positioned to reduce parasitics, such as for example, where substantially all interconnects were formed to have approximately the same width.

In another embodiment, SRAFs can be selectively positioned based on whether a circuit is gate dominated or interconnect dominated. In gate dominated circuits, the transistor channel resistance can be relatively large compared to the metal resistance of the interconnects, so that sensitivity to metal resistance is small. For example, small CPU cores can be gate dominated, and thus more sensitive to parasitic capacitance. This is in contrast to, for example, larger CPU cores or circuits having relatively long chip level routes, which can be interconnect dominated, and thus more sensitive to the resistance of the interconnects.

A process of selectively determining the positioning of SRAFs based on whether a circuit is gate dominated or interconnect dominated may be employed for any integrated circuit design, including, but not limited to, library cell circuits employed in Application Specific Integrated Circuits (ASICs), other cell based circuit designs, as well as custom chips that do not employ cell based design technology.

Figure 4B:
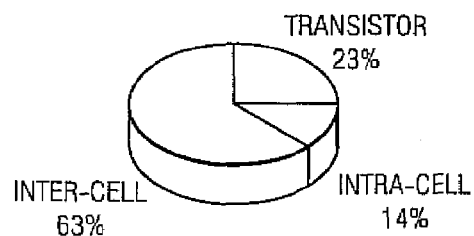

An example of a gate dominated circuit is shown in FIG. 4A, and an example of an interconnect dominated circuit is shown in FIG. 4B. The term "intra-cell refers to parasitic delay associated within the library cells of an Application Specific Integrated Circuit (ASICs) design, other than transistor delay, and can include, for example, contact-to-gate and poly parasitics, and possibly lower level metal interconnect structures, such as metal 1 and metal 2 parasitics. The term "inter-cell" refers to parasitic delay associated with circuitry interconnecting the library cells, and can include, for example, delay caused by capacitance and resistance associated with upper metallization structures and vias. The exemplary percentages shown refer to the contribution of each component to total circuit delay. Thus, for the example gate dominated circuit of FIG. 4A, the transistor delay component is about 48%, the inter-cell component is about 30%, and the intra-cell component is about 22%. Similarly, for the example interconnect dominated circuit of FIG. 4B, the transistor delay component is about 23%, the inter-cell component is about 63%, and the intra-cell component is about 14%. The sum of the components in each of FIGS. 4A and 4B can be referred to as the total circuit delay. The specific percentages shown are exemplary only, and are not intended to limit the claims in any way.

Figure 5A:
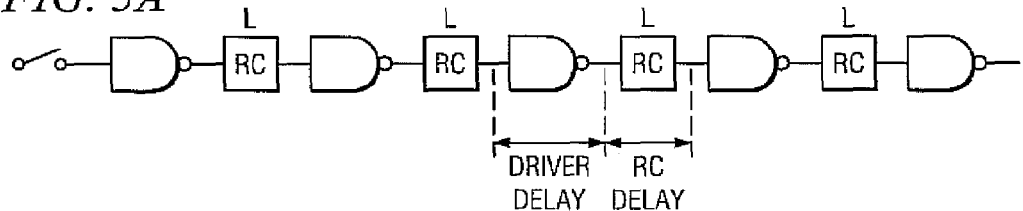
FIG. 5A shows a portion of one embodiment of an exemplary circuit diagram, illustrating the concepts of driver delay and RC delay.
Figure 5B:
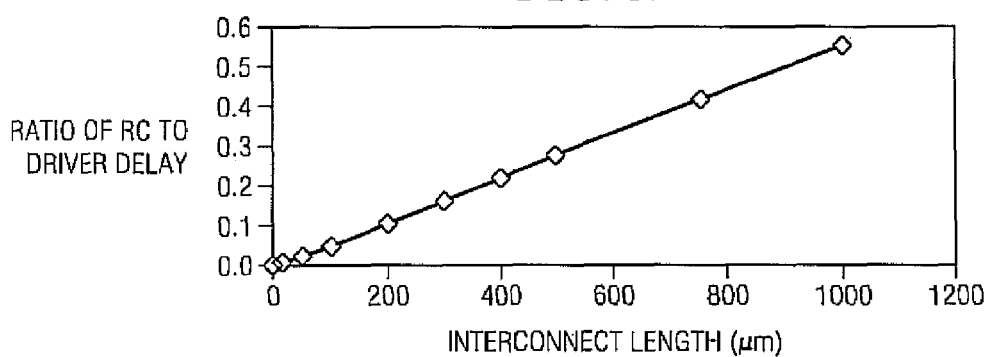
FIG. 5B is a graph illustrating an example of how the ratio of RC to driver delay can increase with increasing interconnect length.

One technique for determining whether a circuit is gate dominated or interconnect dominated is by calculating the ratio of RC delay to driver delay. FIG. 5A, illustrates a portion of one embodiment of an exemplary circuit, which in this case, is a NAND2 chain with RC network having an interconnect length of L. A driver delay can be associated with each logic device and an RC delay associated with the interconnects, as illustrated in FIG. 5A. Driver delay and RC delay can be determined using techniques well known in the art, and a ratio of the RC to driver delay for the circuit can be calculated. As shown in FIG. 5B, the ratio of RC to driver delay increases with increasing interconnect length, L.

Driver delay is a function of parasitic capacitance, while RC delay of the interconnect is more a function of resistance. Thus, the greater the ratio of RC to driver delay, the more sensitive a circuit will be to resistance of the interconnects; and the smaller the ratio of RC to driver delay, the more sensitive a circuit will be to parasitic capacitance.

Accordingly, the choice of whether to implement option one or option two can be made by selecting an RC to driver delay ratio at or below which it is determined that option one provides improved circuit performance, and above which option two provides improved circuit performance. The particular value of the selected ratio may vary depending on, for example, the particular circuit characteristics, the desired circuit performance, and manufacturing costs associated with option one and option two, among other things. For example, in one embodiment, it may be desirable to implement option one at some discrete RC to driver delay ratio that is chosen from values ranging from 0.5 or less. For example, the discrete value may be 0.4. 0.45, or 0.5. If, for example, the discrete value is selected to be 0.4, then option two would be employed for any ratios above 0.4. In yet another embodiment, it may be desirable to implement option one at some discrete RC to driver delay ratio that is chosen from values ranging from about 0.2 or less; and option two for any ratios that are greater than the chosen value. RC to driver delay ratios that are outside of these ranges can also be chosen as the selected value.

Figure 6:
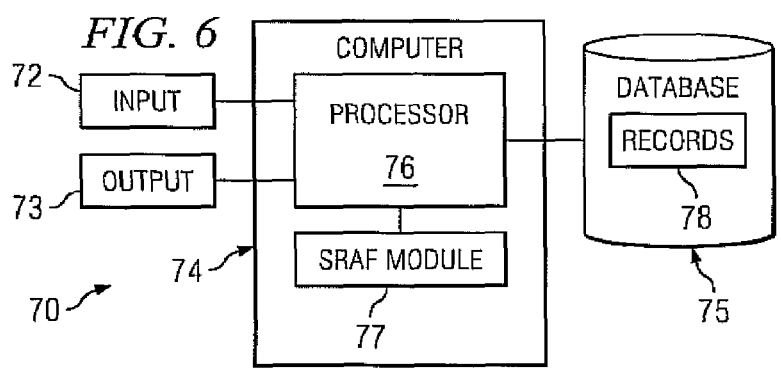
FIG. 6 illustrates a system for selectively positioning SRAFs, according to An embodiment of the present application.

FIG. 6 illustrates a system 70 for selectively positioning SRAFs according to embodiments of the present application. System 70 includes an input device 72 and an output device 73 coupled to a computer 74, which is in turn coupled to a database 75. Input device 72 may include, for example, a keyboard, a mouse, or any other device suitable for transmitting data to computer 74. Output device 73 may include, for example, a display, a printer, or any other device suitable for outputting data received from computer 74.

Computer 74 may include a personal computer, workstation, network computer, wireless computer, or one or more microprocessors within these or other devices, or any other suitable processing device. Computer 74 may include a processor 76, and an SRAF module 77. Computer 74 may also include other modules, as desired.

The above SRAF module 77 can exist as software that includes program instructions in source code, object code, executable code or other formats; program instructions implemented in firmware; or hardware description language (HDL) files. Any of the above can be embodied on a computer readable medium, which include storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes.

Database 75 may include any suitable system for storing data. Database 75 may store records 78 that include data associated with the integrated circuit device features to be patterned.

Processor 76 controls the flow of data between input device 72, output device 73, database 75, and SRAF module 77. SRAF module 77 can receive data from database 75, which can include such data as, for example, design data associated with features of integrated circuit devices to be patterned, including data describing integrated circuit feature patterns to be generated and data associated with forming SRAF patterns. Using such data, the SRAF module 77 can selectively generate SRAF patterns, as described above. For example, SRAF module 77 can choose a desired interconnect pattern option based on predetermined parameters, such as the length of the interconnect and/or the RC to driver delay ratio, and if called for, position SRAFs to achieve the desired interconnect pattern, as described above.

Embodiments of the present application are also directed to an integrated circuit device and method of forming the integrated circuit device by employing a photomask having a photomask pattern prepared by the processes of the present application. The integrated circuit devices can be prepared by, for example, applying a photoresist to a wafer using techniques well known in the art. The photoresist can then be exposed to radiation through a photomask having a photomask pattern prepared by any of the processes of the present application, as described herein. The photoresist can be developed using techniques well known in the art to form a photoresist pattern on the wafer. Processes such as etching or ion implantation can then be carried out using the photoresist pattern to, for example, selectively etch or selectively ion implant portions of the device by techniques well known in the art, in order to form features of the integrated circuit device.

In some embodiments, forming the integrated circuit device using a photomask having photomask patterns generated using the processes of the present application can result in integrated circuits having improved circuit performance. Integrated circuit devices according to the present application can include a plurality of first interconnects formed according to option one, as described herein; and a plurality of second interconnects formed according to option 2, as described herein.

As discussed above, shorter interconnects can be less sensitive to resistance than longer interconnects. Thus, integrated circuits formed using the methods of the present application may employ option one, having a narrower width, for interconnects having a length that is less than a selected value, such as any of the interconnect lengths, $L_{t1}$, disclosed herein; and option two, having an increased width, for interconnects having a length that is greater than a selected value, such as any of the interconnect lengths, $L_{t2}$, disclosed herein.

In other embodiments, the resulting integrated circuits may have interconnects formed according to option one that are positioned in circuits having an RC delay to driver delay ratio that is less than or equal to a selected value, such as, any of the RC delay to driver delay ratios discussed above. Similarly, interconnects formed according to option two may be positioned in circuits having an RC delay to driver delay ratio that is greater than the specified value.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method of creating a photomask including selectively positioned sub-resolution assist features (SRAFs) in a photomask pattern for an interconnect, the method comprising:
   determining if a first interconnect pattern option will result in improved circuit performance compared with a second interconnect pattern option wherein the first option is designed to be formed with SRAFs and the second option is designed to be formed without SRAFs;
   if it is determined that the first option will result in improved circuit performance, selecting the first pattern option as a target pattern and positioning one or more SRAF patterns to facilitate patterning of the first pattern option;
   if it is determined that the first option will not result in improved performance, selecting the second pattern option as a target pattern; and
   creating the photomask based on the selected first or second pattern option;
   wherein the determination of improved circuit performance is made based on resistive-capacitive delay (RC delay) and crosstalk metrics.

2. The method of claim 1, wherein the first pattern option is chosen if an RC delay to driver delay ratio of the circuit is less than or equal to a selected value.

3. The method of claim 2, wherein the selected value is a discrete value chosen from ratios ranging from about 0.5 or less.

4. The method of claim 2, wherein the selected value is a discrete value chosen from ratios ranging from about 0.2 or less.

5. The method of claim 1, wherein the first option comprises an interconnect pattern for a first width interconnect designed to be formed with the SRAFs; the second option comprises an interconnect pattern for a second width interconnect wider than the first width interconnect and designed to be formed without SRAFs; the first option is chosen if it is determined that the interconnect has a target length that is less than or equal to a selected length; and the second option is chosen if it is determined that the interconnect has a target length that is greater than the selected length.

6. The method of claim 5, wherein the selected length is a discrete value chosen from lengths ranging from about 100 microns or less.

7. A method of forming an interconnect, the method comprising:
   applying a photoresist to a wafer;
   exposing the photoresist to radiation through a photomask having a photomask pattern and prepared by the method of claim 1;
   developing the photoresist to form a photoresist pattern on the wafer; and
   etching the wafer using the photoresist pattern to form the interconnect.

8. An integrated circuit device comprising a plurality of interconnects formed by the method of claim 7.

9. A system for creating a photomask including selectively positioned sub-resolution assist features (SRAFs) in a photomask pattern, the system comprising:
   a database operable to store data describing one or more integrated circuit interconnect features having target dimensions; and
   an SRAF module coupled to the database, wherein the SRAF module is embodied on a computer readable storage medium and includes a set of instructions operable to:
      determine if a first interconnect pattern option will result in improved circuit performance compared with a second interconnect pattern option wherein the first option is designed to be formed with SRAFs and the second option is designed to be formed without SRAFs;
      if it is determined that the first option will result in improved circuit performance, select the first pattern option as a target pattern and position one or more SRAF patterns to facilitate patterning of the first pattern option; and
      if it is determined that the first option will not result in improved performance, select the second pattern option as a target pattern;
      wherein the determination of improved circuit performance is made based on resistive-capacitive delay (RC delay) and crosstalk metrics.

10. An integrated circuit device comprising:
   a plurality of first interconnects formed according to a first pattern option having a first width and a first length, the first pattern option designed to be formed with SRAF; and
   a plurality of second interconnects formed according to a second pattern option having a second width and a second length, the second pattern option designed to be formed without SRAF; and
   wherein the first interconnects are positioned in a circuit having an RC delay to driver delay ratio that is less than or equal to a selected value.

11. The integrated circuit of claim 10, wherein the selected value is a discrete value chosen from ratios ranging from about 0.5 or less.

12. The integrated circuit device of claim 10, wherein the selected value is a discrete value chosen from ratios ranging from about 0.2 or less.

13. The integrated circuit device of claim 10, wherein the first width is less than the second width.

14. A method for fabricating an integrated circuit, comprising:
   providing a photomask with a photomask interconnect pattern having target interconnect features with target widths and lengths based on an integrated circuit design;
   forming a layer of electrically conductive material on a wafer;
   depositing a photoresist over the layer of electrically conductive material;
   exposing the deposited photoresist through the photomask interconnect pattern to form a photoresist interconnect pattern on the photoresist;
   etching through the photoresist interconnect pattern to form actual interconnect features having actual widths and lengths on the wafer;
   wherein the photomask interconnect pattern includes sub-resolution assist features positioned proximate target interconnect features that are resistance dominated and omits sub-resolution assist features proximate target interconnect features that are capacitance dominated.

15. The method of claim 14, wherein resistance dominated and capacitance dominated target interconnect features are determined based on target widths.

16. The method of claim 14, wherein resistance dominated and capacitance dominated target interconnect features are determined based on target lengths.

17. The method of claim 16, wherein the resistance dominated and capacitance dominated target interconnect features are determined based on target lengths of about 100 microns or less.

18. The method of claim 17, wherein the resistance dominated and capacitance dominated target interconnect features are determined based on target lengths of about 25 microns or less.

19. The method of claim 18, wherein the resistance dominated and capacitance dominated target interconnect features are determined based on target lengths of less than 10 microns.

20. The method of claim 14, wherein resistance dominated and capacitance dominated target interconnect features are determined based on R-C delay.

21. The method of claim 14, wherein resistance dominated and capacitance dominated target interconnect features are determined based on an R-C delay to driver delay ratio for a circuit component.

22. The method of claim 21, wherein resistance dominated and capacitance dominated target interconnect features are determined based on an R-C delay to driver delay ratio of 0.5 or less.

23. A method for fabricating an integrated circuit, comprising:
   providing a photomask with a photomask interconnect pattern having target interconnect features with target widths and lengths based on an integrated circuit design, and having sub-resolution assist features selectively positioned proximate some of the target interconnect features and omitted proximate others of the target interconnect features;
   forming a layer of electrically conductive material on a wafer;
   depositing a photoresist over the layer of electrically conductive material;
   exposing the deposited photoresist through the photomask interconnect pattern to form a photoresist interconnect pattern on the photoresist;
   etching through the photoresist interconnect pattern to form actual interconnect features having actual widths and lengths on the wafer;
   wherein the selective positioning of the sub-resolution assist features includes:
      determining if a first interconnect pattern option will result in improved circuit performance in terms of circuit delay compared with a second interconnect pattern option, wherein the first option is designed to be formed with sub-resolution assist features and the second option is designed to be formed without sub-resolution assist features; and
      if it is determined that the first option will result in improved circuit performance, selecting the first pattern option as a target pattern and positioning one or more SRAF patterns to facilitate patterning of the first pattern option; and
      if it is determined that the first option will not result in improved performance, selecting the second pattern option as a target pattern.

* * * * *